United States Patent
Lai et al.

(10) Patent No.: US 11,315,945 B2
(45) Date of Patent: Apr. 26, 2022

(54) MEMORY DEVICE WITH LATERAL OFFSET

(71) Applicant: MACRONIX INTERNATIONAL CO., LTD., Hsinchu (TW)

(72) Inventors: Erh-Kun Lai, Taichung (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 16/742,113

(22) Filed: Jan. 14, 2020

(65) Prior Publication Data

US 2021/0217767 A1    Jul. 15, 2021

(51) Int. Cl.
  *H01L 27/11582*    (2017.01)
  *H01L 27/1157*     (2017.01)

(52) U.S. Cl.
  CPC .... *H01L 27/11582* (2013.01); *H01L 27/1157* (2013.01)

(58) Field of Classification Search
  CPC .......................................... H01L 27/115–11597
  See application file for complete search history.

(56) References Cited

U.S. PATENT DOCUMENTS

| 9,362,302 | B1 | 6/2016 | Lai |
| 9,373,636 | B2 | 6/2016 | Davis et al. |
| 9,627,397 | B2 | 4/2017 | Lai et al. |
| 2011/0002178 | A1 | 1/2011 | Hwang et al. |
| 2011/0032772 | A1 | 2/2011 | Aritome |
| 2011/0233648 | A1* | 9/2011 | Seol ............... H01L 27/11551 257/E21.21 |
| 2012/0112264 | A1* | 5/2012 | Lee ................ H01L 27/11578 257/E27.026 |
| 2015/0162342 | A1* | 6/2015 | Lee ................ H01L 29/66833 257/324 |

(Continued)

FOREIGN PATENT DOCUMENTS

| TW | 201238033 A1 | 9/2012 |
| TW | 201428895 A | 7/2014 |

OTHER PUBLICATIONS

TW Office Action dated Sep. 22, 2020 in Taiwan application (No. 109103463).

(Continued)

*Primary Examiner* — Stephen M Bradley
*Assistant Examiner* — Gustavo G Ramallo
(74) *Attorney, Agent, or Firm* — McClure, Qualey & Rodack, LLP

(57) ABSTRACT

A memory device includes a stack structure, a memory element, a channel element, and a semiconductor layer. The stack structure includes a source layer, an insulating layer and gate electrode layers. The insulating layer is on the source layer. The gate electrode layers are on the insulating layer. The memory element is on electrode sidewall surfaces of the gate electrode layers. Memory cells are defined in the memory element between the channel element and the gate electrode layers. The semiconductor layer is electrically connected between the source layer and the channel element. The semiconductor layer and the source layer have an interface therebetween. The interface is at a location on an inside of an insulating sidewall surface of the insulating layer with a lateral offset relative to the insulating sidewall surface.

8 Claims, 13 Drawing Sheets

(56) References Cited

U.S. PATENT DOCUMENTS

| 2015/0200203 | A1* | 7/2015 | Jang | H01L 27/1157 |
|---|---|---|---|---|
| | | | | 438/591 |
| 2016/0204115 | A1 | 7/2016 | Ko et al. | |
| 2017/0207226 | A1 | 7/2017 | Lee | |
| 2017/0256558 | A1* | 9/2017 | Zhang | H01L 27/1207 |
| 2018/0138192 | A1 | 5/2018 | Shin et al. | |
| 2020/0258816 | A1* | 8/2020 | Oki | H01L 23/481 |

OTHER PUBLICATIONS

English translation of TW Office Action dated Sep. 22, 2020 in Taiwan application (No. 109103463).

* cited by examiner

MEMORY DEVICE WITH LATERAL OFFSET

BACKGROUND

Technical Field

The disclosure relates to a memory device.

Description of the Related Art

As critical dimensions of devices in integrated circuits shrink toward perceived limits of manufacturing technologies, designers have been looking to techniques to achieve greater storage capacity, and to achieve lower costs per bit.

SUMMARY

The present disclosure relates to a memory device.

According to an embodiment, a memory device is provided. The memory device comprises a stack structure, a memory element, a channel element, and a semiconductor layer. The stack structure comprises a source layer, an insulating layer and gate electrode layers. The insulating layer is on the source layer. The gate electrode layers are on the insulating layer. The memory element is on electrode sidewall surfaces of the gate electrode layers. Memory cells are defined in the memory element between the channel element and the gate electrode layers. The semiconductor layer is electrically connected between the source layer and the channel element. The semiconductor layer and the source layer have an interface therebetween. The interface is at a location on an inside of an insulating sidewall surface of the insulating layer with a lateral offset relative to the insulating sidewall surface.

According to another embodiment, a memory device is provided. The memory device comprises a stack structure, a memory element, a channel element, and a semiconductor layer. The stack structure comprises a source layer and gate electrode layers on the same side of the source layer. The memory element is on electrode sidewall surfaces of the gate electrode layers. Memory cells are defined in the memory element between the channel element and the gate electrode layers. The semiconductor layer is electrically connected between the channel element and the source layer. The semiconductor layer comprises a first semiconductor portion and a second semiconductor portion. The second semiconductor portion is electrically connected between the first semiconductor portion and the channel element. A semiconductor sidewall surface of the first semiconductor portion is at a location on an outside of a semiconductor sidewall surface of the second semiconductor portion with a lateral offset relative to the semiconductor sidewall surface of the second semiconductor portion.

According to yet another embodiment, a memory device is provided. The memory device comprises a stack structure, a memory element, a channel element, and a semiconductor layer. The stack structure comprises a source layer and gate electrode layers on the same side of the source layer. The memory element is on electrode side all surfaces of the gate electrode layers. Memory cells are defined in the memory element between the channel element and the gate electrode layers. The semiconductor layer comprises a first semiconductor portion and a second semiconductor portion. The second semiconductor portion is electrically connected between the first semiconductor portion and the channel element. A lateral size of the first semiconductor portion is bigger than a lateral size of the second semiconductor portion.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
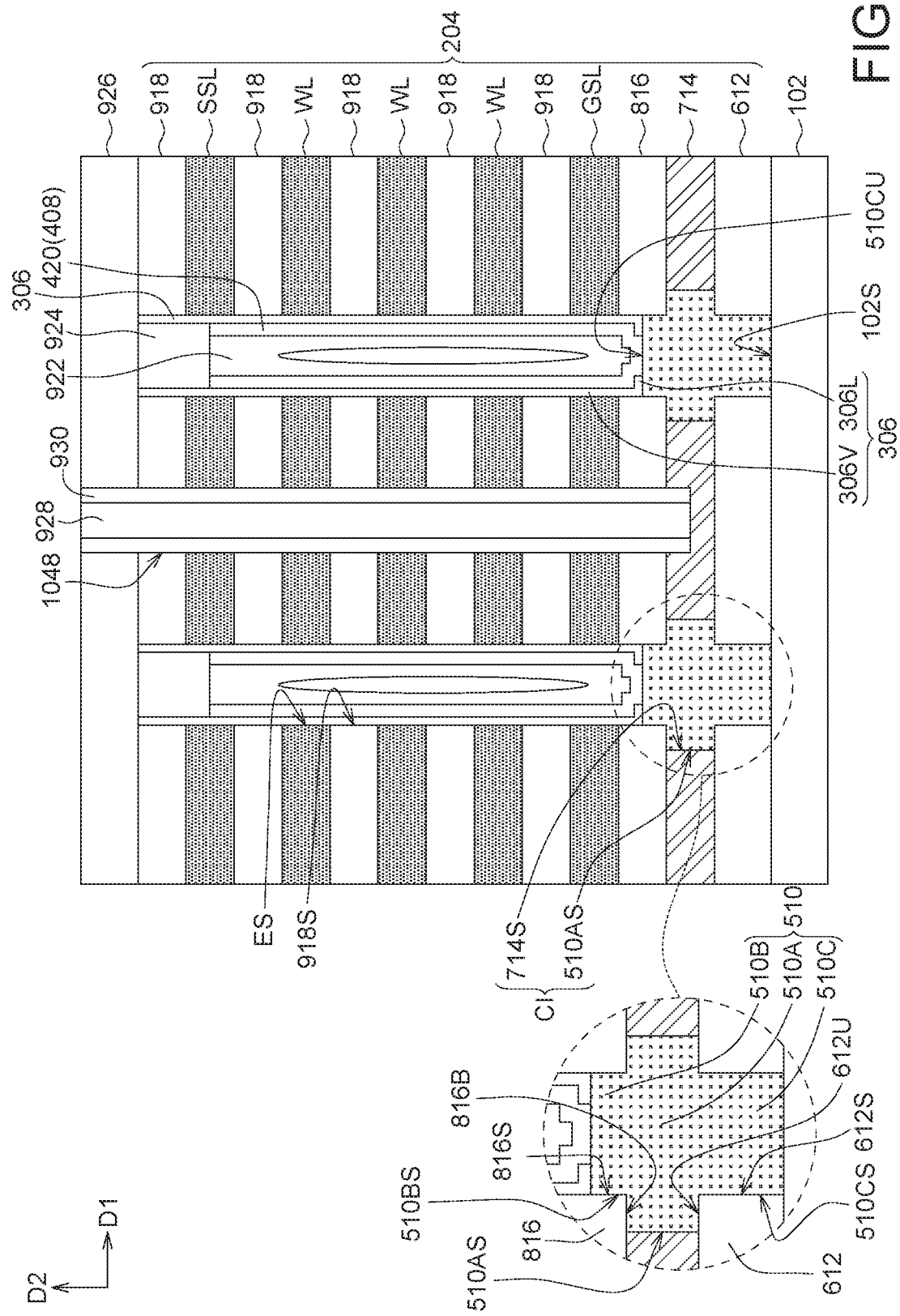
FIG. 1 illustrates a diagrammatic cross-section view of a memory device according to an embodiment.

FIG. 1 is referred, which illustrates a diagrammatic cross-section view of a memory device according to an embodiment.

The memory device may comprise a semiconductor substrate 102, a stack structure 204, a memory element 306, a channel element 408 and a semiconductor layer 510.

The stack structure 204 may comprise an insulating layer 612, a source layer 714, an insulating layer 816, a gate electrode layer SSL, a gate electrode layer GSL, gate electrode layers WL, and insulating films 918. The insulating layer 612 may be on the semiconductor substrate 102. The source layer 714 may be on the insulating layer 612. The insulating layer 816 may be on the source layer 714. The gate electrode layers (comprising the gate electrode layer SSL, the gate electrode layer GSL, and the gate electrode layers WL) and the insulating films 918 may be stacked on the insulating layer 816 alternately. The source layer 714 and the gate electrode layers (comprising the gate electrode layer SSL, the gate electrode layer GSL, and the gate electrode layers WL) may be electrically isolated from each other by the insulating layer 816 and the insulating films 918.

The semiconductor layer 510 is electrically connected between the source layer 714 and the channel element 408. The semiconductor layer 510 may comprise a first semiconductor portion 510A, a second semiconductor portion 510B and a third semiconductor portion 510C. The first semiconductor portion 510A may be electrically connected between the second semiconductor portion 510B and the third semiconductor portion 510C. The second semiconductor portion 510B may be electrically connected between the first semiconductor portion 510A and the channel element 408. The third semiconductor portion 510C may be adjoined on an upper semiconductor surface 102S of the semiconductor substrate 102, and adjoined with an insulating sidewall surface 612S of the insulating layer 612.

The source layer 714 and the first semiconductor portion 510A of the semiconductor layer 510 may have an interface CI therebetween. The interface CI comprises a portion adjoined with the electrode sidewall surface 714S of the source layer 714 and a semiconductor sidewall surface 510AS of the first semiconductor portion 510A. The interface CI may be a vertical crystalline interface. The interface CI is at a location on an inside of an insulating sidewall surface 816S of the insulating layer 816 with a lateral offset relative to the insulating sidewall surface 816S. The interface CI is at a location on an inside of the insulating sidewall surface 612S of the insulating layer 612 with a lateral offset relative to the insulating sidewall surface 612S. In the present disclosure, what is said as "lateral" may be a direction parallel to a first direction D1 as shown in the figure. For example, the first direction D1 may be a X direction. The first semiconductor portion 510A of the semiconductor layer 510 may be adjoined with between a lower insulating surface 816B of the insulating layer 816 and an upper insulating surface 612U of the insulating layer 612. The first semiconductor portion 510A and the third semiconductor portion 510C of the semiconductor layer 510 may be adjoined between the source layer 714 and the semiconductor substrate 102.

For example, the semiconductor sidewall surface 510AS of the first semiconductor portion 510A, a semiconductor sidewall surface 510BS of the second semiconductor portion 510B, and a semiconductor sidewall surface 510CS of the third semiconductor portion 510C are on the same side of the semiconductor layer 510. The semiconductor sidewall surface 510AS of the first semiconductor portion 510A may be at a location on an outside of the semiconductor sidewall surface 510BS of the second semiconductor portion 510B with a lateral offset relative to the semiconductor sidewall surface 510BS. The semiconductor sidewall surface 510AS of the first semiconductor portion 510A may be at a location on an outside of the semiconductor sidewall surface 510CS of the third semiconductor portion 510C with a lateral offset relative to the semiconductor sidewall surface 510CS. The semiconductor sidewall surface 510BS of the second semiconductor portion 510E may be substantially aligned with the semiconductor sidewall surface 510CS of the third semiconductor portion 510C.

As shown in the figure, a lateral size of the first semiconductor portion 510A may be bigger than a lateral size of the second semiconductor portion 510B. The lateral size of the first semiconductor portion 510A may be bigger than a lateral size of the third semiconductor portion 510O, In an embodiment, the lateral size of the second semiconductor portion 510B may be identical with the lateral size of the third semiconductor portion 510C.

A conductive property of the source layer 714 may be different from conductive properties of the first semiconductor portion 510A, the second semiconductor portion 510E and the third semiconductor portion 510C. A conductivity type of the semiconductor substrate 102 may be opposite to a conductivity type of the source layer 714. In an embodiment, the semiconductor substrate 102 has a P type material. The source layer 714 has an N type material. The semiconductor layer 510 has an un-doped material or a P-type dopant doped material.

The memory element 306 may comprise a laterally-extended memory portion 306L and a vertically-extended memory portion 306V adjoined with the laterally-extended memory portion 306L. The laterally-extended memory portion 306L is on an upper semiconductor surface 510CU of the third semiconductor portion 510C. The vertically-extended memory portion 306V may be on electrode sidewall surfaces ES of the gate electrode layers (comprising the gate electrode layer SSL, the gate electrode layer GSL, and the gate electrode layers WL), insulating sidewall surfaces 918S of the insulating films 918, and the insulating sidewall surface 816S of the insulating layer 816. In the present disclosure, what is said as "vertical" may be a direction parallel to a second direction D2 as shown in the figure. The second direction D2 may be a Z direction.

In this embodiment, the channel element 408 comprises a channel layer 420. The channel layer 420 may be extended on the upper semiconductor surface 510CU of the third semiconductor portion 510C, a memory sidewall surface and an upper memory surface of the laterally-extended memory portion 306L, and a memory sidewall surface of the vertically-extended memory portion 306V.

A dielectric film 922 may be on the channel layer 420. A pad element 924 may be on the dielectric film 922, and electrically connected to the channel element 408. In embodiments, the pad element 924 may be electrically connected to an upper bit line contact (not shown), and electrically connected to a bit line. A dielectric layer 926 may be on the stack structure 204. A conductive source element 928 may be extending through the gate electrode layer SSL, the gate electrode layer GSL, the gate electrode layers WL, the insulating films 918 and the insulating layer 816. The conductive source element 928 is electrically connected with the source layer 714. The conductive source element 928 may be electrically insulated from the gate electrode layer SSL, the gate electrode layer GSL, and the gate electrode layers WL by the dielectric element 930. The source layer 714, and the first semiconductor portion 510A and the second semiconductor portion 510B of the semiconductor layer 510 may be electrically connected between the conductive source element 928 and the channel element 408.

The memory device comprises a 3D vertical channel NAND string. The gate electrode layer SSL of the most top electrode layer may be functioned as a string selection line, the gate electrode layer GSL of the most bottom electrode layer may be functioned as a ground selection line, and the other middle gate electrode layers WL between the gate electrode layer SSL and the gate electrode layer GSL may be functioned as word lines. Memory cells may be defined in the memory element 306 between the channel element 408 and the gate electrode layers WL. The NAND string comprises the memory cells electrically connected with each other in series. In an embodiment, the memory device may be operated by a method comprising providing a voltage to the gate electrode layer GSL so as to control a formation of an inversion channel in the semiconductor layer 510. As such, no PN junction exists between the source layer 714 and the semiconductor layer 510. A current from the bit line may transfer through a path of the pad element 924, the channel element 408, the semiconductor layer 510, the source layer 714 and the conductive source element 928 in order, and transfer out from the conductive source element 928. The source layer 714 (such as a heavily doped N-type material) and the conductive source element 928 (such as a metal material), providing a current path in a vertical-bottom-up direction, may have low resistance property. Therefore, a resistance of the whole current path can be reduced. Efficiency of the memory device can be improved.

The current would not flow into the semiconductor substrate 102 having the opposing conductivity type (such as the P type conductivity). Since no PN junction is between a source line and the semiconductor substrate 102, there is no junction capacitance. It will reduce RC delay and have a higher speed operation.

Figure 2:
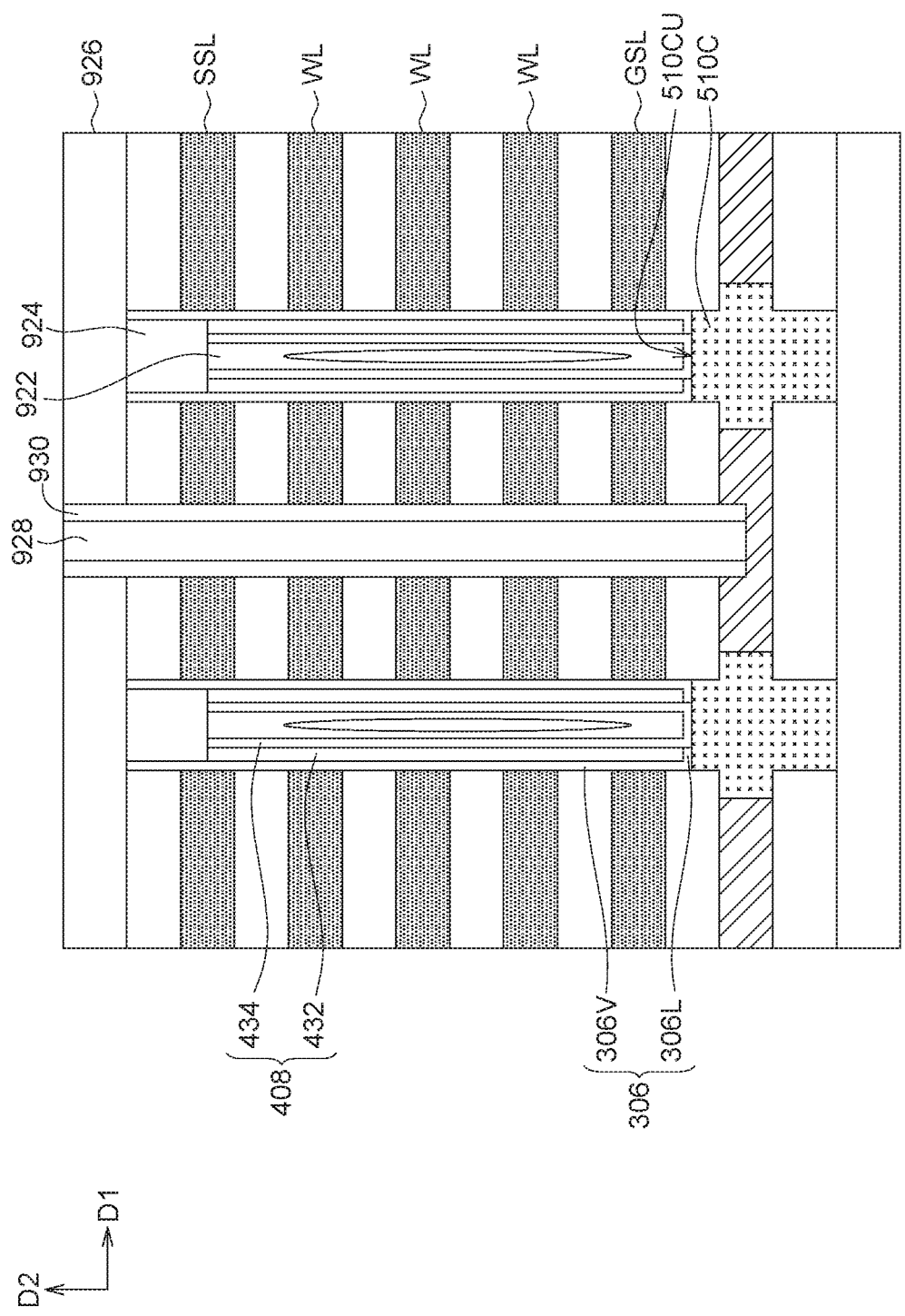
FIG. 2 illustrates a diagrammatic cross-section view of a memory device according to another embodiment.

FIG. 2 is referred, which illustrates a diagrammatic cross-section view of a memory device of another embodiment. The difference of the memory device shown in FIG. 2 and the memory device shown in FIG. 1 is described as the following. In this embodiment, the channel element 408 comprises a channel layer 432 and a channel layer 434. The channel layer 432 may be on the upper memory surface of the laterally-extended memory portion 306L and the memory sidewall surface of the vertically-extended memory portion 306V. The channel layer 434 may be extended on the upper semiconductor surface 510CU of the third semiconductor portion 510C, the memory sidewall surface of the laterally-extended memory portion 306L, and a channel sidewall surface of the channel layer 432. The dielectric film 922 may be on the channel layer 434.

Figure 3A:
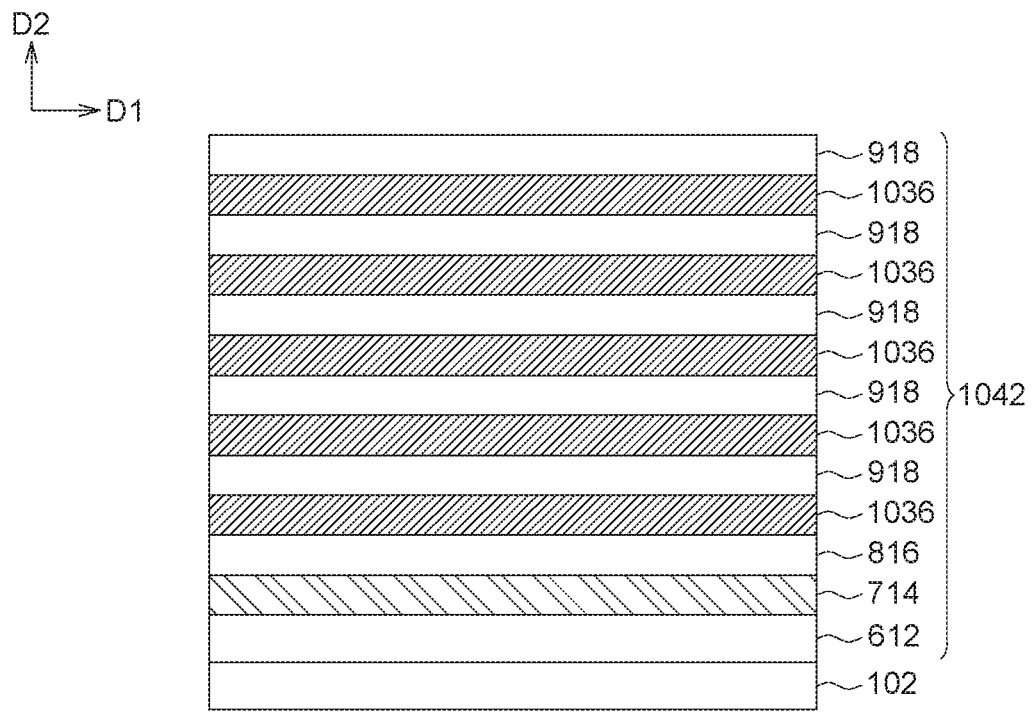
FIG. 3A to FIG. 3O illustrates a manufacturing method for a memory device according to an embodiment.
Figure 3B:
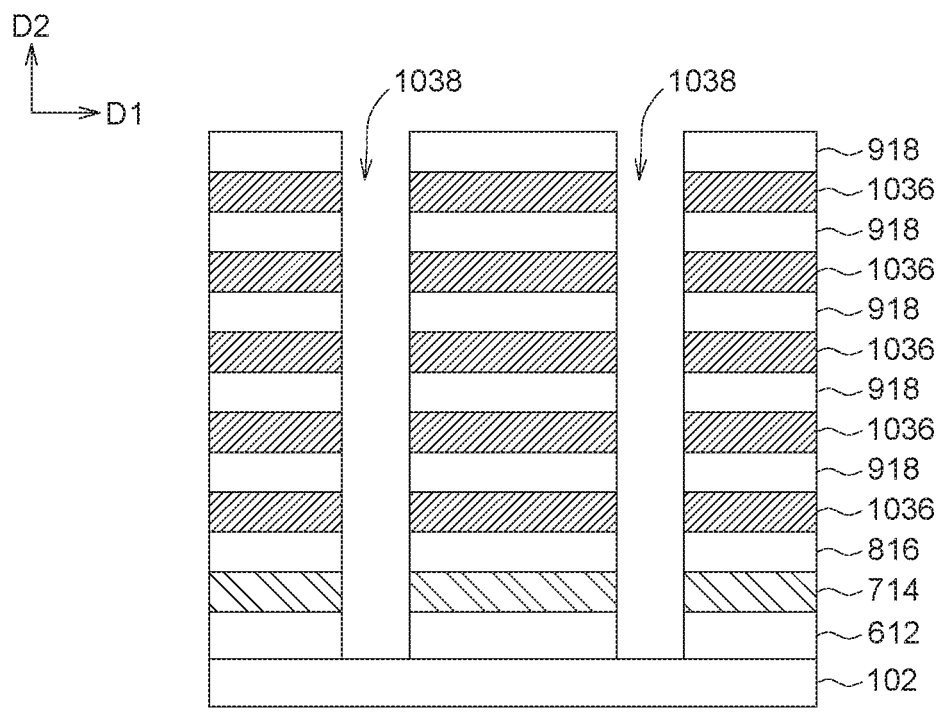
Figure 3C:
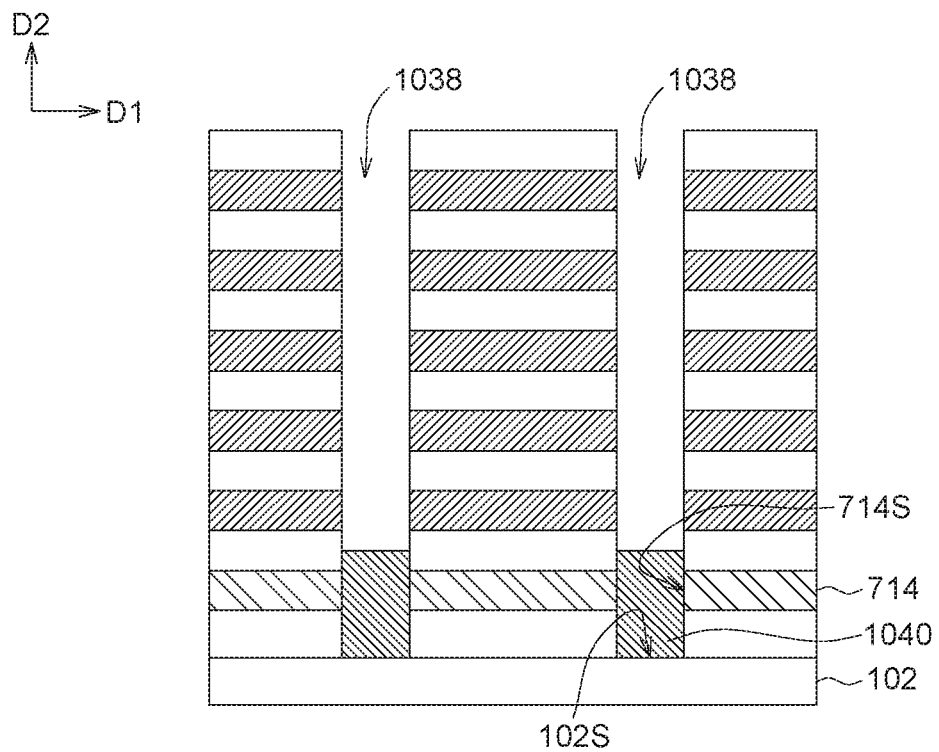
Figure 3D:
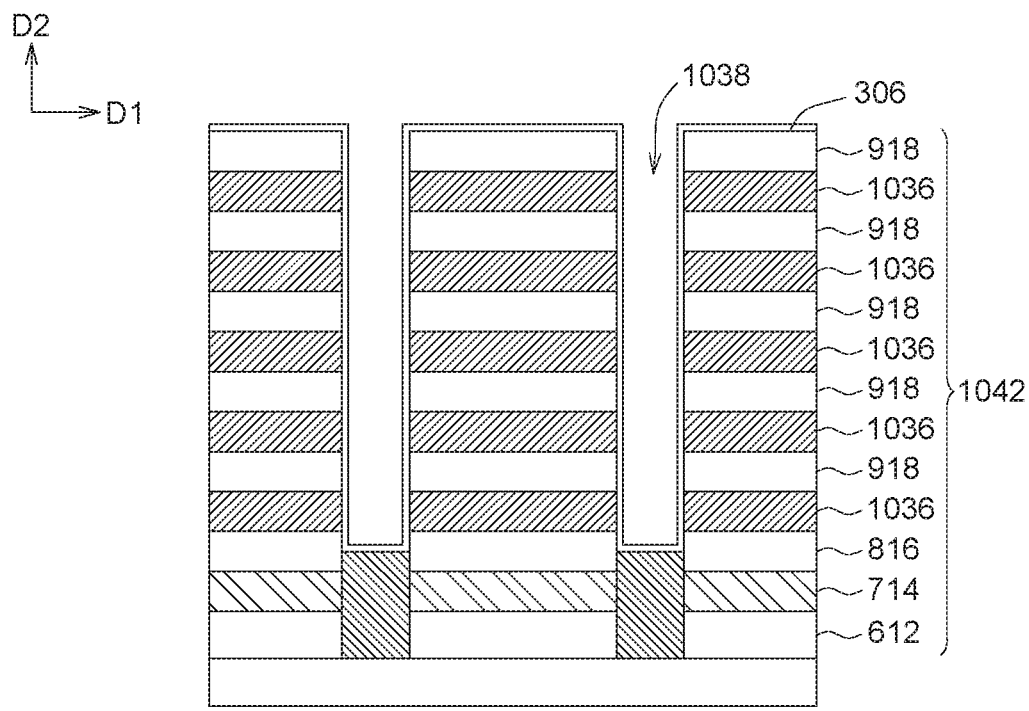
Figure 3E:
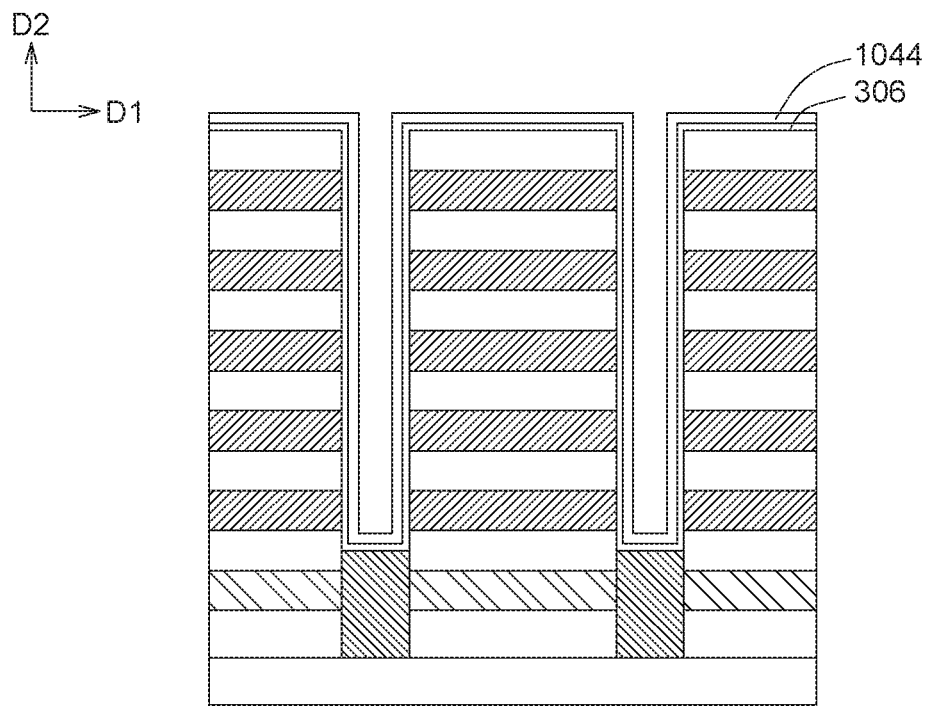
Figure 3F:
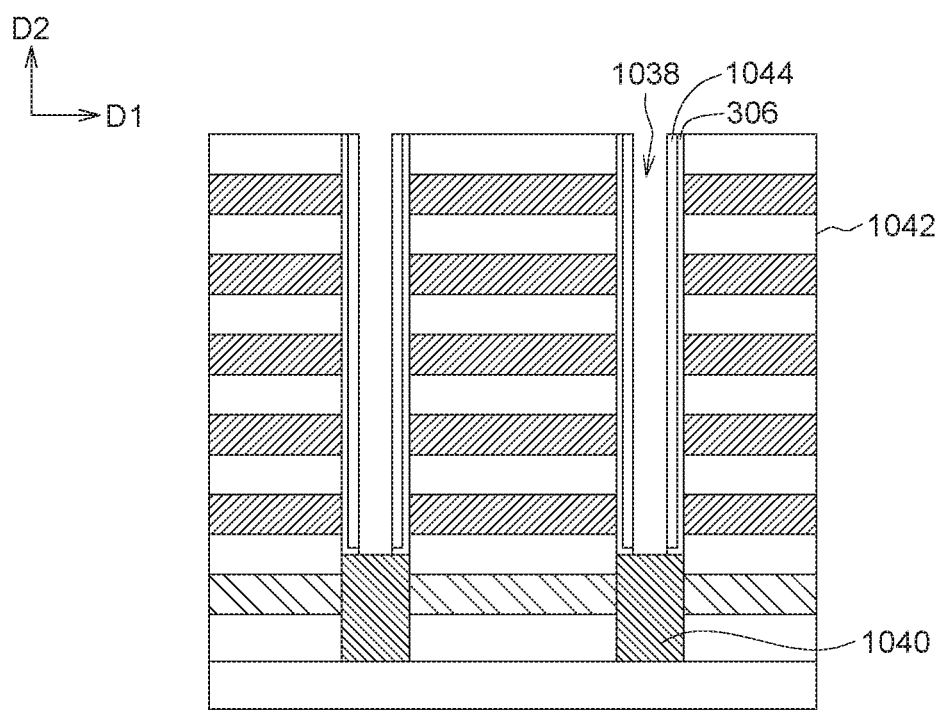
Figure 3G:
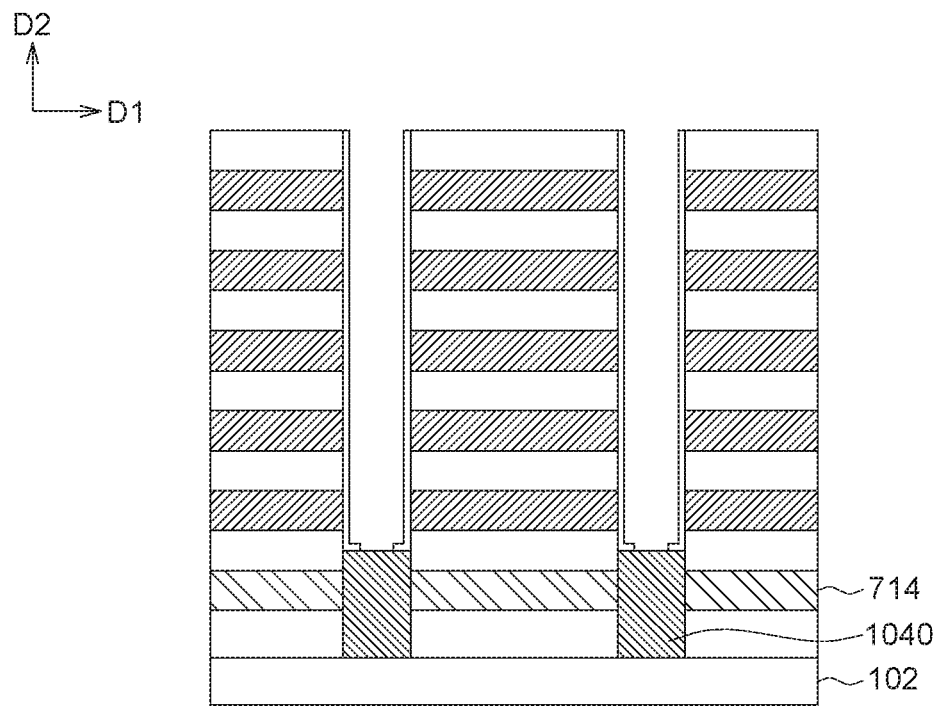
Figure 3H:
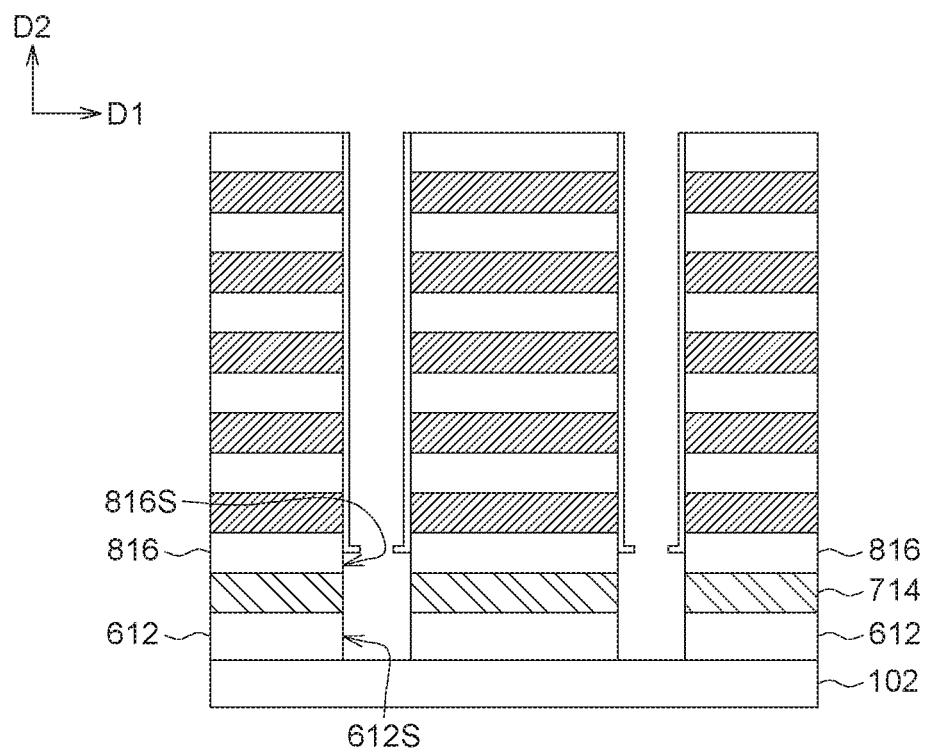
Figure 3I:
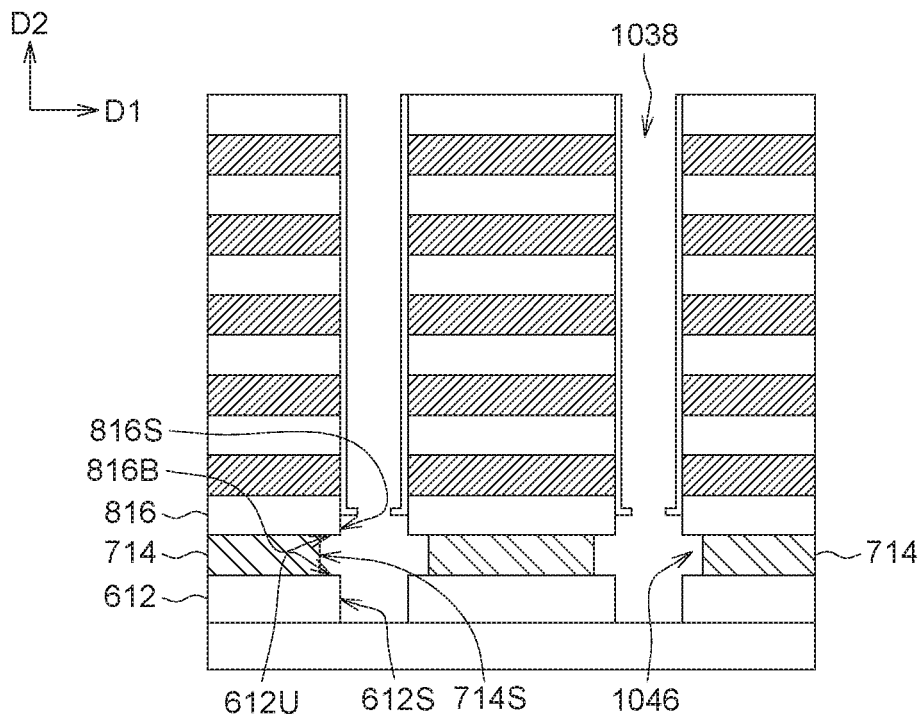
Figure 3J:
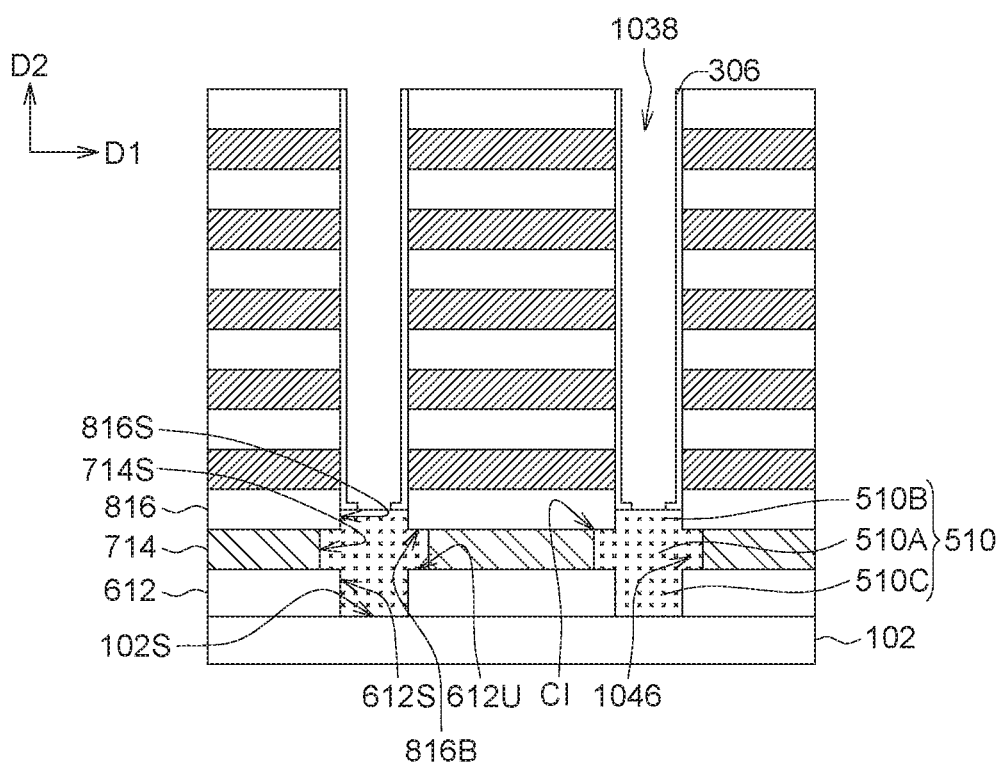
Figure 3K:
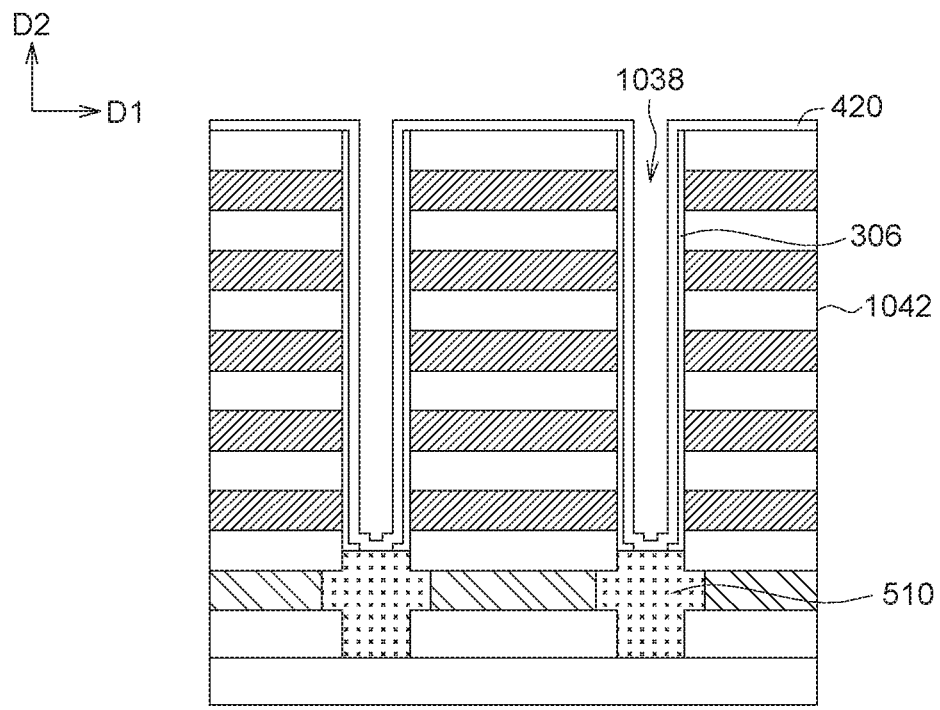
Figure 3L:
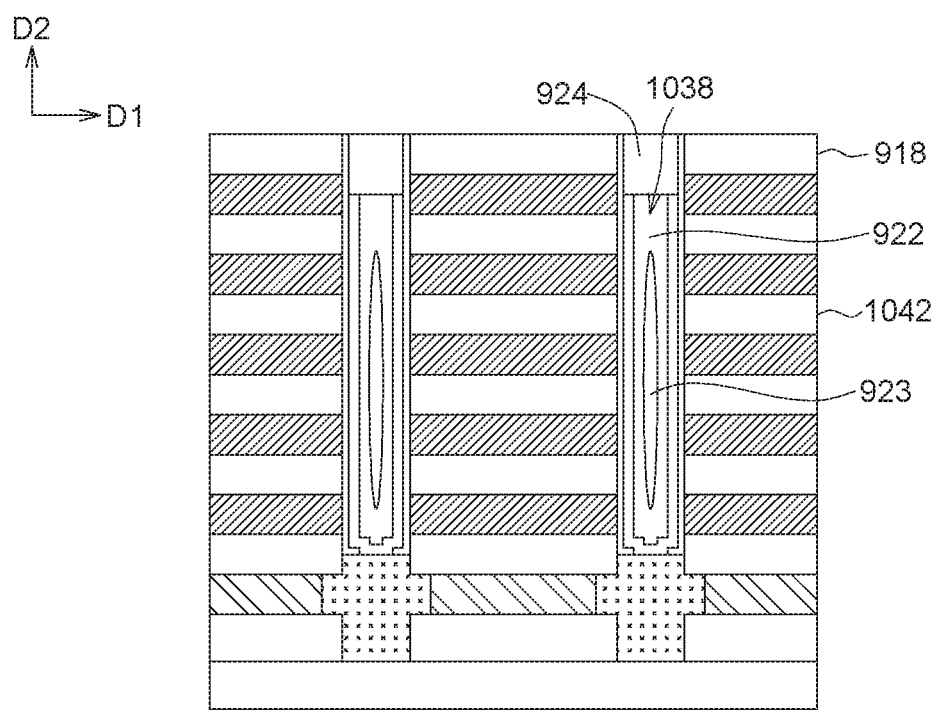
Figure 3M:
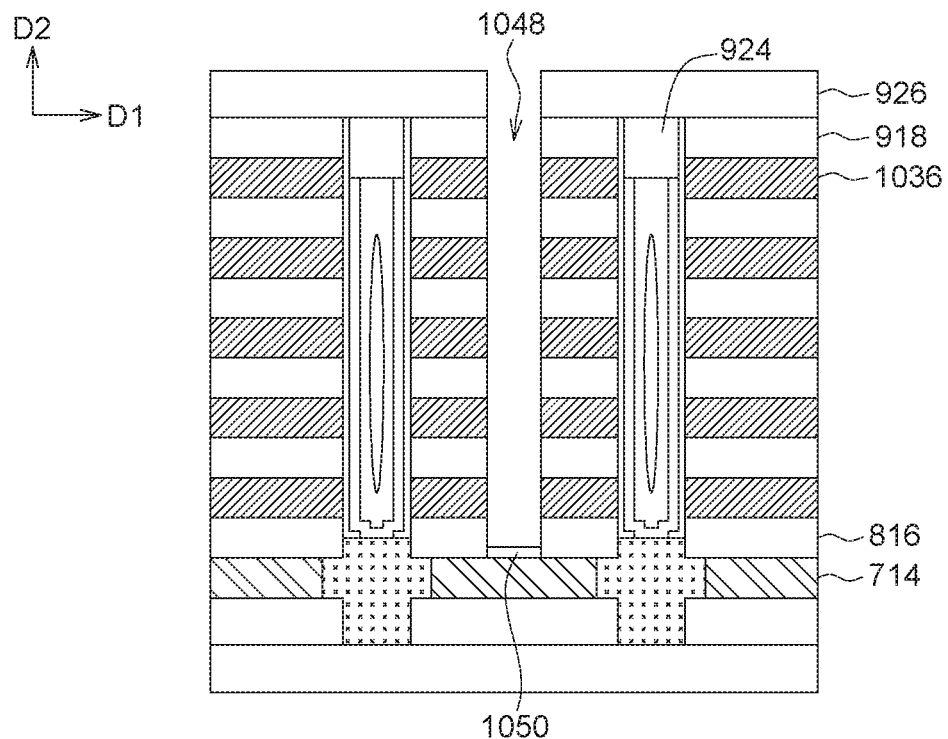
Figure 3N:
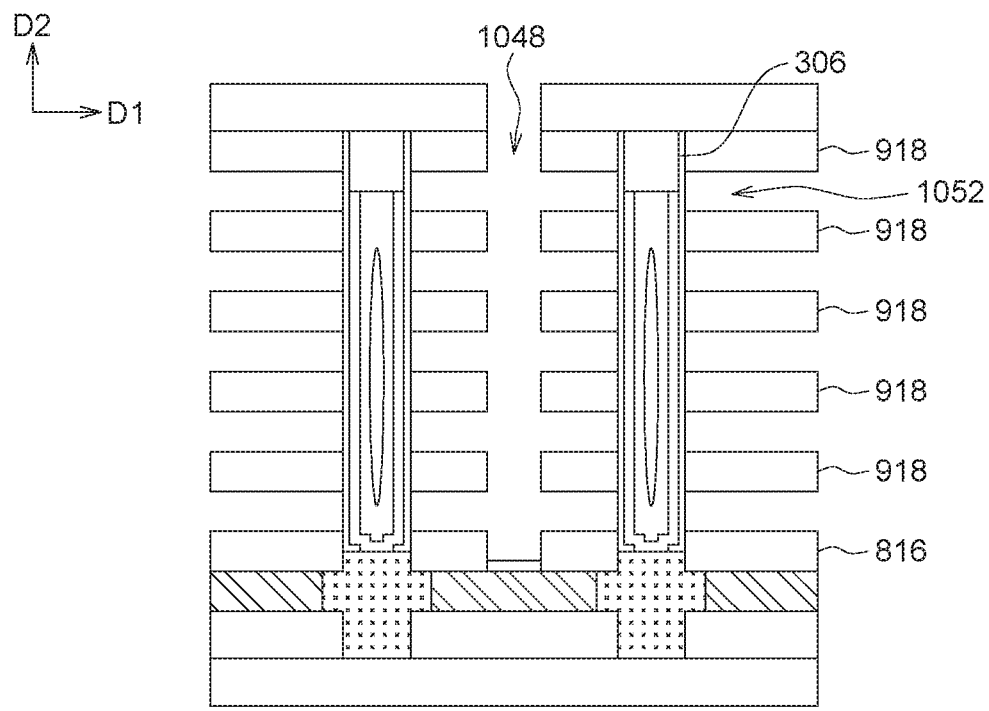
Figure 3O:
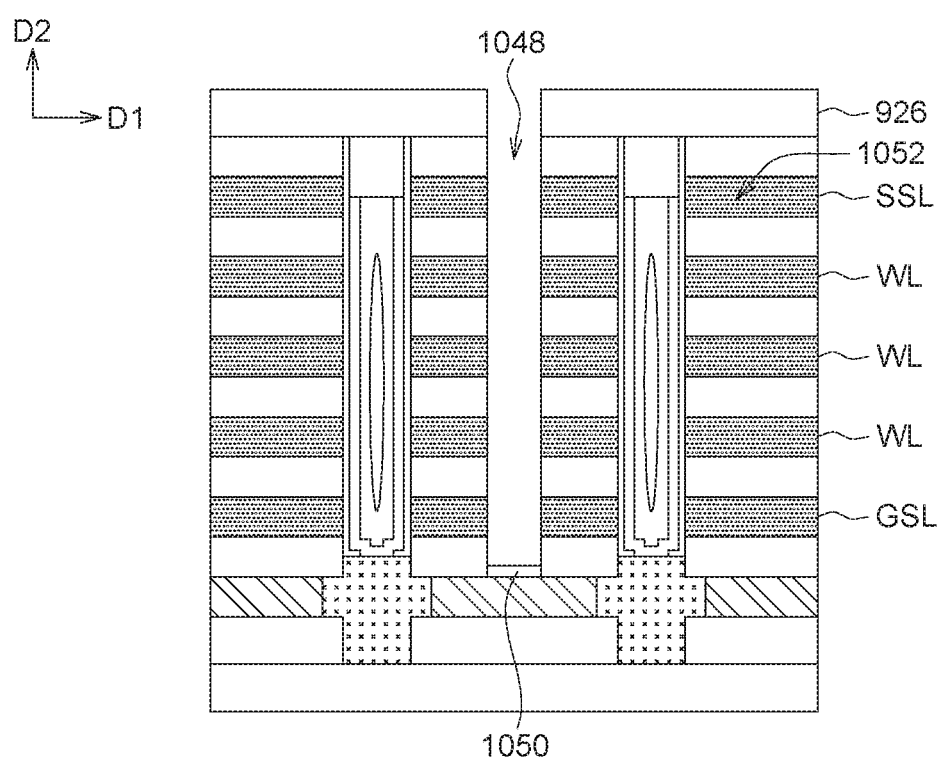

In an embodiment, the memory device as shown in FIG. 1 may be manufactured by a process flow referring to FIG. 3A to FIG. 3O.

Referring to FIG. 3A, the semiconductor substrate 102 is provided. The semiconductor substrate 102 may comprise a silicon substrate, or other suitable semiconductor materials. The semiconductor substrate 102 may comprise a material of a first conductivity type, such as a material doped with a dopant of the first conductivity type. For example, the semiconductor substrate 102 may comprise a P-type well. A stack structure 1042 may be formed on the semiconductor substrate 102. In an embodiment, the insulating layer 612 may be formed on the semiconductor substrate 102. The source layer 714 may be formed on the insulating layer 612. The source layer 714 may comprise a material of a second conductivity type, such as a material doped with a dopant of the second conductivity type. In an embodiment, the source layer 714 comprises an N-type material, such as a heavily doped N-type material. The insulating layer 816 may be formed on the source layer 714. The insulating films 918 and material layers 1036 may be alternately stacked on the insulating layer 816. Materials of the insulating layer 612, the insulating layer 816 and the insulating film 918 may be different from a material of the material layer 1036. In an embodiment, the materials of the insulating layer 612, the insulating layer 816 and the insulating film 918 may comprise an oxide such as silicon oxide. The material of the material layer 1036 may comprise a nitride such as silicon nitride. However, the present disclosure is not limited thereto.

Referring to FIG. 3B, a patterning step may be performed by using photolithography and etching processes to form an opening 1038 passing through the insulating films 918, the material layers 1036, the insulating layer 816, the source layer 714 and the insulating layer 612, and exposing the semiconductor substrate 102. The semiconductor substrate 102 may be used as an etching stop layer. In an embodiment, the sidewall surfaces of the layers exposed by the opening 1038 may be aligned with each other.

Referring to FIG. 3O, a material layer 1040 may be formed on the bottom portion of the opening 1038. The material layer 1040 may be formed by a deposition method. In an embodiment, the material layer 1040 may be formed by a selective epitaxial method, grown from the electrode sidewall surface 714S of the source layer 714 and the upper semiconductor surface 102S of the semiconductor substrate 102 exposed by the opening 1038, and adjoined between the source layer 714 and the semiconductor substrate 102. In embodiments, the material layer 1040 is not limited to the profile as shown in the figure. The material layer 1040 may have any possible profile resulted from an epitaxial growth from the electrode sidewall surface 714S and the upper semiconductor surface 102S. For example, an upper surface of the material layer 1040 may be a planar surface or a non-planar surface. In an embodiment, the material layer 1040 may be a semiconductor layer, comprising a material such as $SiGe_x$. However, the present disclosure is not limited thereto. In an embodiment, a thermal anneal step may be performed to eliminate a void in the material.

Referring to FIG. 3D, the memory element 306 may be formed in the opening 1038 and on an upper surface of the stack structure 1042 by a suitable deposition method. The memory element 306 may comprise any kind of charge trapping structure, such as an ONO structure, an ONONO structure, an ONONONO structure, or BE-SONOS structure, etc. For example, a charge trapping layer may use a nitride such as silicon nitride, or other high-K materials comprising a metal oxide such as $Al_2O_3$, $HfO_2$, and the like.

Referring to FIG. 3E, a material layer 1044 may be formed on the memory element 306. In an embodiment, the material layer 1044 may comprise an un-doped polysilicon. However, the present disclosure is not limited thereto. The material layer 1044 may use other suitable materials.

Referring to FIG. 3F, an anisotropic etching method may be used to remove a bottom portion of the material layer 1044 in opening 1038 and a portion of the material layer 1044 on the upper surface of the stack structure 1042, remaining a portion of the material layer 1044 on the sidewall of the opening 1038. Then, a portion of memory element 306 not covered by the material layer 1044 may be removed by a suitable etching method so as to expose the material layer 1040.

Referring to FIG. 3G, the material layer 1044 as shown in FIG. 3F may be removed by a suitable etching method. In an embodiment, the etching step may use a wet etching method. For example, an etchant solution such as $NH_4OH$ and so on may be applied. In an embodiment, the etching step may comprise a standard cleaning 1 (SC1) process, which may use a cleaning solution comprising water, $NH_3$, $H_2O_2$, However, the present disclosure is not limited thereto.

Referring to FIG. 3H, the material layer 1040 shown in FIG. 3G may be removed by a suitable etching method. In an embodiment, the performed etching method may have an etching selectivity to the material layer 1040, and may substantially not etch the other elements such as the source layer 714, the semiconductor substrate 102, etc.

Referring to FIG. 3I, the source layer 714 may be etched back to form a recess 1046 communicated with the opening 1038. Through the etching back process, the electrode sidewall surface of the source layer 714 is transferred from the location substantially aligning with the insulating sidewall surface 816S of the insulating layer 816 and the insulating sidewall surface 612S of the insulating layer 612 as shown in FIG. 3H, laterally toward the inner portion of the source layer 714 to be the electrode sidewall surface 714S. The electrode sidewall surface 714S is at a location on an inside of the insulating sidewall surface 816S of the insulating layer 816 with a lateral offset relative to the insulating sidewall surface 816S. In addition, the electrode sidewall surface 714S is at a location on an inside of the insulating sidewall surface 612S of the insulating layer 612 with a lateral offset relative to the insulating sidewall surface 612S. In an embodiment, a lateral size of the etched portion of the source layer 714 (or a lateral offset size of the electrode sidewall surface 714S, or a lateral size of the recess 1046) may be 5 nm to 50 nm, such as 20 nm, for example. However, the present disclosure is not limited thereto. The performed etching back method may have an etching selectivity to the source layer 714, and substantially not etch the other elements, such as the insulating layer 816, the insulating layer 612, etc. In an embodiment, the etching back process may use a wet etching method, for example, applying an etchant solution such as $NH_4OH$ and so on. In an embodiment, the etching back step may comprise a standard cleaning 1 (SC1) process, which may apply a cleaning solution comprising water, $NH_3$, $H_2O_2$, for example.

Referring to FIG. 3J, the semiconductor layer 510 may be formed on the bottom of the opening 1038 and in the recess 1046. The semiconductor layer 510 may comprise a silicon material, such as polysilicon or single crystalline silicon, and so on. The semiconductor layer 510 may be formed by a deposition method. In an embodiment, the semiconductor layer 510 may be formed by a selective epitaxial method, grown from the electrode sidewall surface 714S of the source layer 714 and the upper semiconductor surface 102S of the semiconductor substrate 102 exposed by the recess 1046, and adjoined among the source layer 714, the semiconductor substrate 102 and the memory element 306. In addition, the semiconductor layer 510 and the source layer 714 may have the interface CI therebetween. The semiconductor layer 510 and the semiconductor substrate 102 may have an interface, such as a crystalline interface, therebetween. In embodiments, the semiconductor layer 510 is not limited to the profile as shown in the figure. The semiconductor layer 510 may have any possible profile resulted from an epitaxial growth from the electrode sidewall surface 714S and the upper semiconductor surface 102S. For example, an upper surface of the semiconductor layer 510 may be a planar surface or a non-planar surface.

In an embodiment, the semiconductor layer 510 and the source layer 714 adjoined with each other are formed as different doped state respectively. For example, the semiconductor layer 510 is formed with a material comprising an un-doped semiconductor material, or a semiconductor material doped with a P-type dopant, and the source layer 714 adjoined with the semiconductor layer 510 is formed with a material comprising a semiconductor material doped with a N-type dopant, such as a heavily doped N-type semiconductor material. In this embodiment, the semiconductor layer 510 is formed after the formation of the memory element 306, and therefore is not subjected to a thermal process performed for the memory element 306. Therefore, a diffusion of the N type dopant of the source layer 714 toward the semiconductor layer 510 can be restricted. In addition, a portion of the first semiconductor portion 510A of the semiconductor layer 510 formed in the recess 1046 (i.e. the portion of the first semiconductor portion 510A extended between the upper insulating surface 612U of the insulating layer 612 and the lower insulating surface 816B of the insulating layer 816, or the portion of the first semiconductor portion 510A extended beyond the insulating sidewall surface 816S of the insulating layer 816 and the insulating sidewall surface 612S of the insulating layer 612) may also prove an acceptable diffusion area for the N-type dopant from the source layer 714, so as to avoid a decreased efficiency problem of the memory device resulted from an over-diffusion of the N-type dopant (e.g, a diffusion beyond the insulating sidewall surface 816S of the insulating layer 816/the insulating sidewall surface 612S of the insulating layer 612).

Referring to FIG. 3K, the channel layer 420 may be formed on the memory element 306, the semiconductor layer 510 and the upper surface of the stack structure 1042. In an embodiment, the channel layer 420 comprises an un-doped polysilicon material. However, the present disclosure is not limited thereto. The channel layer 420 may use other suitable materials.

Referring to FIG. 3L, the dielectric film 922 may be formed in the opening 1038. The dielectric film 922 may be formed by a suitable deposition method. The dielectric film 922 may be a non-conformal material film, and may have an air gap 923 therein. In an embodiment, the dielectric film 922 may comprise an oxide such as silicon oxide, but is not limited thereto. The dielectric film 922 may use other suitable dielectric materials. A portion of the dielectric film 922 on the upper surface of the stack structure 1042 may be removed by a chemical mechanical polishing method. The chemical mechanical polishing process may stop on the channel layer 420. Next, an etching back step may be performed to the dielectric film 922 and the channel layer 420 to form a recess. The pad element 924 may be formed in the recess. In an embodiment, the pad element 924 may comprise a conductive material or a semiconductor material such as an N-type semiconductor material, such as a heavily doped N-type semiconductor material. The pad element 924 may be formed by a suitable deposition method. A portion of the pad element 924 on the upper surface of the stack structure 1042 may be removed by a chemical mechanical polishing method stopping on the insulating film 918 of the most top layer (functioned as a hard mask) of the stack structure 1042. In an embodiment, the pad element 924 would provide a landing area for an upper bit line contact, and electrically connected to a bit line.

Referring to FIG. 3M, the dielectric layer 926 may be formed. The dielectric layer 926 may be used as a cap layer for protecting the pad element 924. In an embodiment, the dielectric layer 926 may comprise an insulating material comprising an oxide such as silicon oxide, or other suitable materials. A photolithography process and an etching process may be used to form a trench 1048 passing through the dielectric layer 926, the insulating films 918, the material layers 1036 and the insulating layer 816, and exposing the source layer 714. In an embodiment, the etching step may use the source layer 714 as an etching stop layer. Then, an oxidization step may be performed to the source layer 714 exposed by the trench 1048 to form an oxide layer 1050 on an upper electrode surface of the source layer 714.

Referring to FIG. 3N, an etching step may be performed to remove the material layers 1036 exposed by the trench 1048 as shown in FIG. 3M to form a slit 1052. The slit 1052 may expose the upper insulating surface/lower insulating surface of the insulating film 918, the upper insulating surface of the insulating layer 816 and the memory sidewall surface of the memory element 306. In an embodiment, a wet etching method may be performed, dipping the structure as shown in FIG. 3M in an etchant solution (for example comprising $H_3PO_4$ and so on) having an etching selectivity to the material layers 1036, to remove the material layers 1036 (such as silicon nitride).

Referring to FIG. 3O, the gate electrode layer SSL, the gate electrode layer GSL, and the gate electrode layers WL may be formed to fill the slit 1052. In an embodiment, before the formation of the gate electrode layer SSL, the gate electrode layer GSL and the gate electrode layers WL, a dielectric thin film (not shown) may be formed on surfaces of the elements exposed by the slits 1052, and then the gate electrode layer SSL, the gate electrode layer GSL and the gate electrode layers WL may be formed on the dielectric thin film and filling the slits 1052. The dielectric thin film may comprise a high-k material, or other suitable dielectric materials, for example. In an embodiment, the gate electrode material/dielectric material, and the oxide layer 1050 in the trench 1048 may be removed by a suitable etching method.

Referring back to FIG. 1, the dielectric element 930 may be formed on the sidewall surfaces of the elements exposed by the trench 1048. In an embodiment, the dielectric element 930 may be formed by a method comprising depositing a dielectric thin film in the trench 1048 and on the upper surface of the dielectric layer 926, and then removing a portion of the dielectric thin film on the bottom of the trench 1048 and on the upper surface of dielectric layer 926 by using an anisotropic etching process. The remained portion of the dielectric thin film from the etching process forms the dielectric element 930. In an embodiment, the dielectric element 930 may comprise an oxide such as silicon oxide. However, the present disclosure is not limited thereto. Next, the conductive source element 928 may be formed to fill the trench 1048. The conductive source element 928 is electrically connected to the source layer 714. In an embodiment, the conductive source element 928 may be formed by a method comprising forming a conductive material in the trench 1048 and on the upper surface of the dielectric layer 926 by a suitable deposition method, and then removing a portion of the conductive material on the upper surface of the dielectric layer 926 by a chemical mechanical polishing method. The conductive material may comprise an alloy or a metal such as TiN, W, and the like.

In another embodiment, the memory device as shown in FIG. 2 may be formed by a process flow applying steps shown in FIG. 4A to FIG. 4E. For example, after the process steps referring to FIG. 3A to FIG. 3B, the process method referring to FIG. 4A may be performed.

Figure 4A:
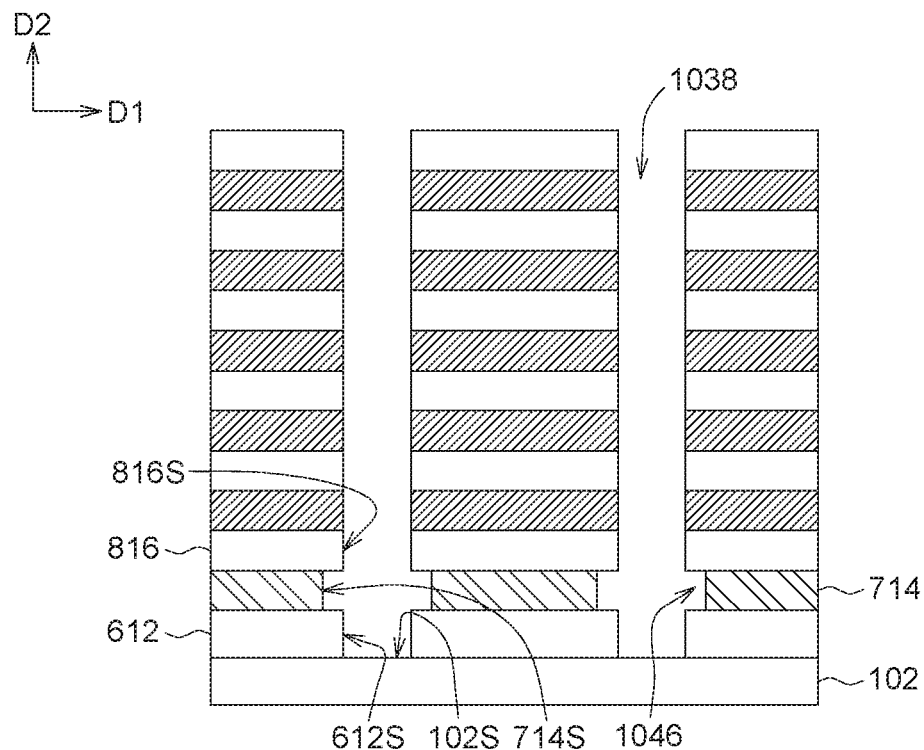
FIG. 4A to FIG. 4E illustrates a manufacturing method for a memory device according to another embodiment.

Referring to FIG. 4A, the source layer 714 may be etched back to form a recess 1046 communicated with the opening 1038. Through the etching back process, the electrode sidewall surface of the source layer 714 is transferred from the location substantially aligning with the insulating sidewall surface 816S of the insulating layer 816 and the insulating sidewall surface 612S of the insulating layer 612, laterally toward the inner portion of the source layer 714 to be the electrode sidewall surface 714S.

Figure 4B:
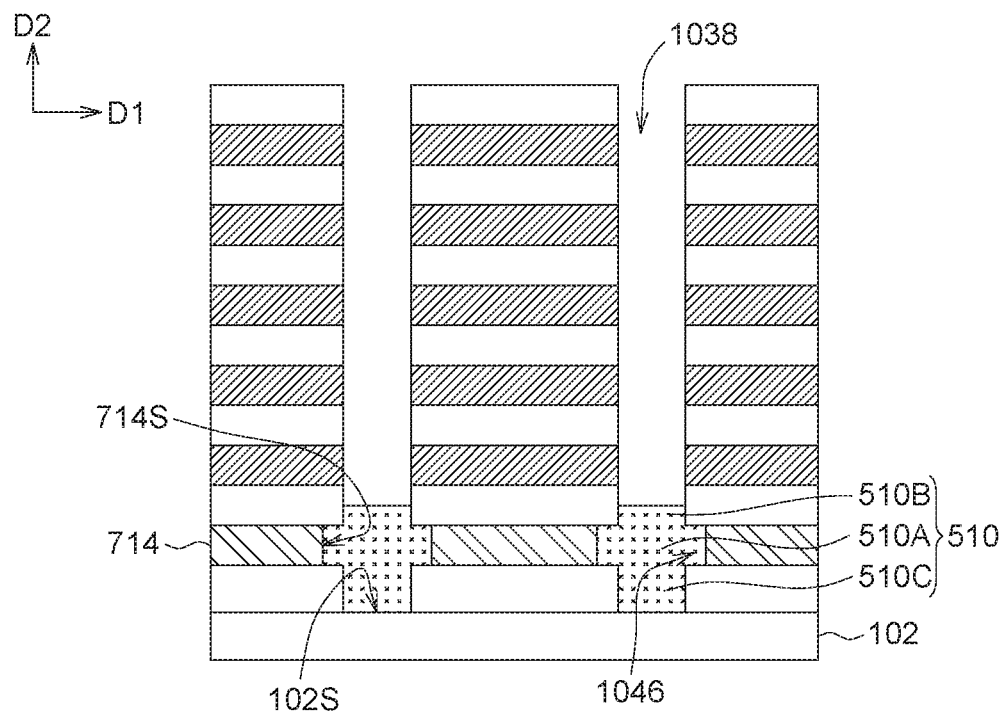
Figure 4C:
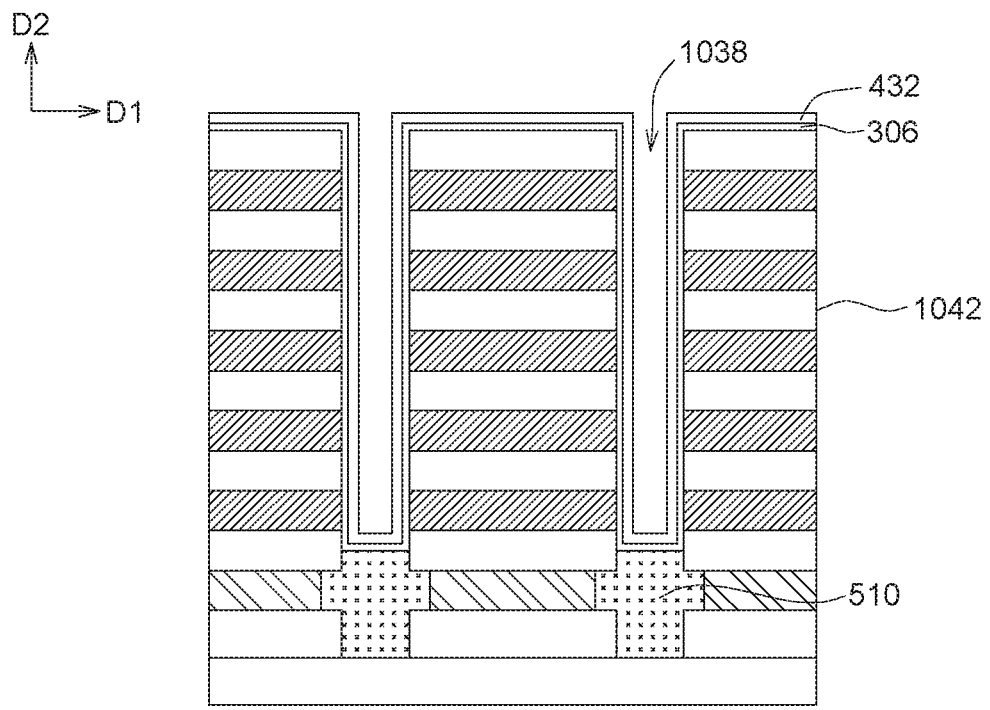

Referring to FIG. 4B, the semiconductor layer 510 may be formed on the bottom of the opening 1038 and in the recess 1046. The semiconductor layer 510 may comprise a silicon material, such as polysilicon, single crystalline silicon and so on. The semiconductor layer 510 may be formed by a deposition method. In an embodiment, the semiconductor layer 510 may be formed by a selective epitaxial method, grown from the electrode sidewall surface 714S of the source layer 714 and the upper semiconductor surface 102S of the semiconductor substrate 102 exposed by the recess 1046, and adjoined between the source layer 714 and the semiconductor substrate 102. In embodiments, the semiconductor layer 510 is not limited to the profile as shown in the figure. The semiconductor layer 510 may have any possible profile resulted from an epitaxial growth from the electrode sidewall surface 714S and the upper semiconductor surface 102S. For example, the upper surface of the semiconductor layer 510 may be a planar surface or a non-planar surface. In an embodiment, a thermal anneal step may be performed to eliminate a void in the material.

Figure 4D:
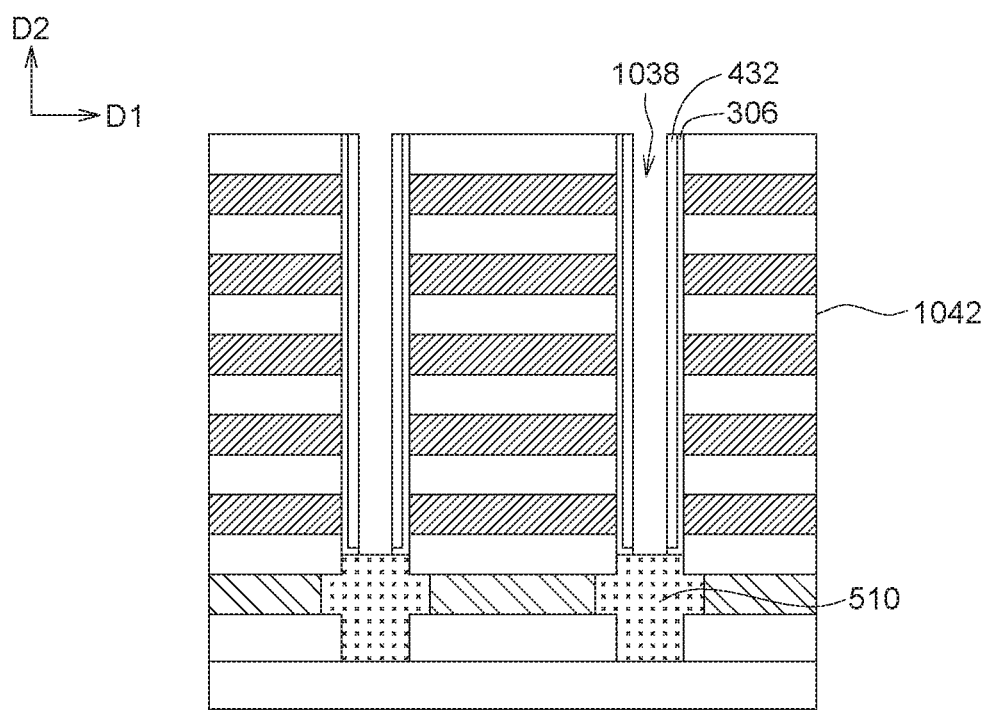

Referring to FIG. 4D, the memory element 306 may be formed in the opening 1038 and on the upper surface of the stack structure 1042. Next, the channel layer 432 may be formed on the memory element 306. For example, the channel layer 432 may comprises an un-doped polysilicon formed by a suitable deposition process. However, the present disclosure is not limited thereto.

Referring to FIG. 4D, an anisotropic etching method may be used to remove a bottom portion of the channel layer 432 in opening 1038 and a portion of the channel layer 432 on the upper surface of the stack structure 1042, remaining a portion of the channel layer 432 on the sidewall of the opening 1038. Then, a portion of memory element 306 not covered by the channel layer 432 may be removed by a suitable etching method so as to expose the semiconductor layer 510.

Figure 4E:
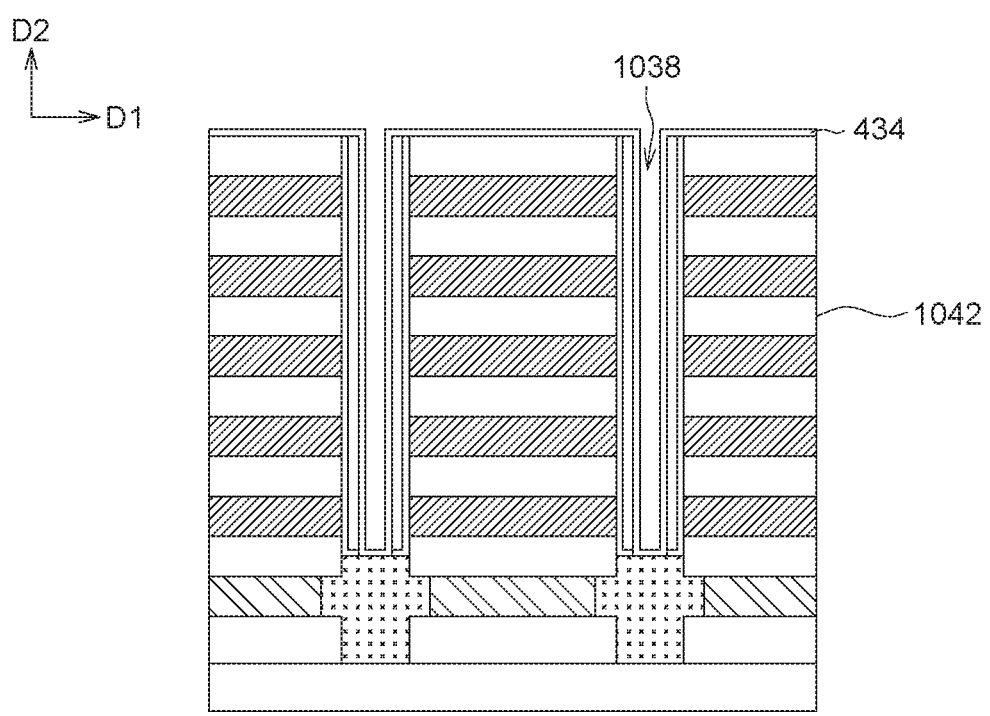

Referring to FIG. 4E, the channel layer 434 may be formed in the opening 1038 and on the upper surface of the stack structure 1042. The channel layer 434 may comprise an un-doped polysilicon formed by a suitable deposition process, for example. However, the present disclosure is not limited thereto.

Next, the manufacturing process concept similar to those referring FIG. 3L to FIG. 3O, and then FIG. 1 may be applied to form the dielectric film 922, the pad element 924, the dielectric layer 926, the gate electrode layer SSL, the gate electrode layer GSL, the gate electrode layers WL, the dielectric element 930, and the conductive source element 928, so as to form the memory device as shown in FIG. 2.

The memory device in the present disclosure is not limited to the foregoing described manufacturing method. The manufacturing process could be varied properly. In an embodiment, for example, after the formation process for memory element 306 referring to FIG. 3D is performed, an anisotropic etching step may be performed to remove a portion of the memory element 306 on the bottom of the opening 1038 and a portion of the memory element 306 on the upper surface of the stack structure 1042. The steps for forming/removing the material layer 1044 described with referring to FIG. 3E and FIG. 3F may be omitted. Next, the processes described with referring to FIG. 3G and thereafter may be performed. As such, the memory device as shown in FIG. 1 may be also formed by the varied process flow.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A memory device, comprising:
a stack structure, comprising:
  a source layer;
  a first insulating layer on the source layer; and
  gate electrode layers on the first insulating layer;
a memory element on electrode sidewall surfaces of the gate electrode layers;
a channel element, wherein memory cells are defined in the memory element between the channel element and the gate electrode layers; and
a semiconductor layer electrically connected between the source layer and the channel element, wherein the semiconductor layer and the source layer have a vertical interface therebetween, the semiconductor layer and the first insulating layer have a lateral interface therebetween, the vertical interface is directly connected to the lateral interface and at a location on an inside of an insulating sidewall surface of the first insulating layer with a lateral offset relative to the insulating sidewall surface.

2. The memory device according to claim 1, wherein the semiconductor layer is adjoined with a lower insulating surface of the first insulating layer.

3. The memory device according to claim 1, wherein the stack structure further comprises a second insulating layer, the semiconductor layer is between a lower insulating surface of the first insulating layer and an upper insulating surface of the second insulating layer.

4. The memory device according to claim 1, wherein the stack structure further comprises a second insulating layer, wherein the source layer is between the first insulating layer and the second insulating layer, the vertical interface is at a location on an inside of an insulating sidewall surface of the second insulating layer with a lateral offset relative to the insulating sidewall surface of the second insulating layer.

5. The memory device according to claim 1, further comprising a semiconductor substrate, wherein the stack structure further comprises a second insulating layer between the semiconductor layer and the semiconductor substrate.

6. The memory device according to claim 1, further comprising a semiconductor substrate, wherein the semiconductor layer is adjoined on an upper semiconductor surface of the semiconductor substrate, a conductivity type of the semiconductor substrate is opposite to a conductivity type of the source layer.

7. The memory device according to claim 1, further comprising a conductive source element extending through the gate electrode layers, wherein the semiconductor layer and the source layer are electrically connected between the conductive source element and the channel element.

8. The memory device according to claim 1, comprising a NAND string comprising the memory cells.

* * * * *